(12) United States Patent
Shimoaoki et al.

(10) Patent No.: US 7,977,039 B2
(45) Date of Patent: Jul. 12, 2011

(54) RINSE TREATMENT METHOD, DEVELOPING TREATMENT METHOD AND DEVELOPING APPARATUS

(75) Inventors: Takeshi Shimoaoki, Koshi (JP); Junichi Kitano, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 754 days.

(21) Appl. No.: 11/515,800

(22) Filed: Sep. 6, 2006

(65) Prior Publication Data

US 2007/0072092 A1    Mar. 29, 2007

(30) Foreign Application Priority Data

Sep. 28, 2005    (JP) .................................. 2005-281541

(51) Int. Cl.
*G03F 7/30*    (2006.01)
(52) U.S. Cl. ........................................ 430/434; 430/331
(58) Field of Classification Search ............... 430/270.1, 430/331, 434
See application file for complete search history.

(56) References Cited

U.S. PATENT DOCUMENTS

| 5,326,672 | A | * | 7/1994 | Tanaka et al. ................ 430/322 |
| 5,968,268 | A |   | 10/1999 | Kitano et al. .................. 118/52 |
| 6,059,880 | A |   | 5/2000 | Kitano et al. .................. 118/52 |
| 6,159,662 | A | * | 12/2000 | Chen et al. .................... 430/313 |
| 6,419,408 | B1 |   | 7/2002 | Inada .......................... 396/604 |
| 6,749,688 | B2 |   | 6/2004 | Tateyama et al. ............. 118/667 |
| 6,827,973 | B2 |   | 12/2004 | Nagashima .................... 427/240 |
| 2005/0284502 | A1 | * | 12/2005 | Watanabe et al. ................ 134/2 |
| 2006/0124586 | A1 | * | 6/2006 | Kobayashi et al. ............. 216/41 |

FOREIGN PATENT DOCUMENTS

| JP | 06-163391 |   | 6/1994 |
| JP | 07-142349 |   | 6/1995 |
| JP | 2001-005191 |   | 1/2001 |
| WO | WO 2004/051379 | * | 6/2004 |
| WO | WO 2006/006317 |   | 1/2006 |

* cited by examiner

*Primary Examiner* — Cynthia H Kelly
*Assistant Examiner* — Anca Eoff
(74) *Attorney, Agent, or Firm* — Smith, Gambrell & Russell, LLP

(57) ABSTRACT

In the present invention, in a rinse treatment method of cleaning a substrate after an exposed pattern thereon has been subjected to developing treatment, the following steps are performed such as supplying pure water onto the substrate to clean the substrate with the pure water; supplying a first rinse solution composed of a surfactant with a predetermined concentration onto the substrate to clean the substrate with the first rinse solution; and supplying a second rinse solution composed of a surfactant with a concentration lower than that of the first rinse solution onto the substrate to clean the substrate with the second rinse solution. According to the present invention, in the rinse treatment of the substrate after developing treatment, it is possible to dry the substrate without causing pattern collapse to restrain variation in pattern line width, and to reduce the remaining precipitation-based defects to increase the productivity.

3 Claims, 9 Drawing Sheets

RINSE TREATMENT METHOD, DEVELOPING TREATMENT METHOD AND DEVELOPING APPARATUS

BACKGROUND OF THE INVENTION

1. Field of the Invention

The present invention relates to a rinse treatment method of performing rinse treatment on a substrate such as a semiconductor wafer after an exposed pattern thereon has been subjected to developing treatment in the photolithography process, a developing treatment method including the rinse treatment method, and a developing apparatus for carrying out the developing treatment method.

2. Description of the Related Art

In a photolithography process in manufacturing a semiconductor device, for example, a resist coating treatment of applying a resist solution being a coating solution onto, for example, a semiconductor wafer (hereinafter, referred to as a wafer) being a substrate to be processed, to form a resist film, exposure processing of exposing the resist film in a predetermined pattern, heat-processing of accelerating chemical reaction in the resist film after the exposure, developing treatment of developing the exposed resist film and so on are performed in sequence, thereby forming a predetermined resist pattern on the wafer.

In the developing treatment in such a photolithography process, a developing solution is applied to the wafer to form a paddle of the developing solution to cause developing treatment to proceed by natural convection for a predetermined time, and the developing solution is then shaken off. Subsequently, pure water is supplied as a rinse solution, and the developing solution and the rinse solution remaining on the wafer are shaken off, whereby the wafer is dried.

Recently, however, with advancement of exposure technology and so on, the semiconductor wafers become increasingly miniaturized to result in a microscopic resist pattern with a high aspect ratio, which is suffered from problems. One of the problems is that a so-called "pattern collapse" occurs in which in shaking-off drying at the final stage in the developing step, the resist pattern is pulled and collapsed due to the surface tension of the rinse solution when the rinse solution flows out from the pattern.

Another problem is that, with the miniaturization of the pattern, a chemically amplified type resist is used as the photoresist which produces a large amount of precipitates (precipitation-based defects) in the developing step.

As a means to solve the aforementioned "pattern collapse," Japanese Patent Application Lain-open No. H7-142349 proposes a technical art of mixing, for example, a surfactant into the rinse solution to reduce the surface tension of the rinse solution. Further, Japanese Patent Application Laid-open No. 2001-5191 discloses a process of supplying a surfactant at the time when performing rinse treatment on the substrate after developing treatment.

Besides, to address the problem of increase in precipitation-based defects, conventionally removal of the precipitates has been performed by keeping a longer rinse treatment time.

However, for the problem of the pattern collapse, if the surfactant is used as the rinse solution, there occurs another problem. The problem is that the surfactant permeates into the resist pattern after developing treatment which has swelled and increased in permeability, thus varying the pattern line width (CD: Critical Dimension).

Besides, for the problem of increase in precipitation-based defects, if the rinse time is extended, the throughput decreases to decrease the productivity.

SUMMARY OF THE INVENTION

The present invention has been developed in consideration of the above-described circumstances, and its object is to make it possible, in the rinse treatment of the substrate after developing treatment, to dry the substrate without causing pattern collapse to restrain variation in the pattern line width, and to reduce the remaining precipitation-based defects to increase the productivity.

To achieve the above objects, the present invention is a rinse treatment method of cleaning a substrate after an exposed pattern thereon has been subjected to developing treatment, the method including the steps of: supplying pure water onto the substrate to clean the substrate with the pure water; supplying a first rinse solution composed of a surfactant with a predetermined concentration onto the substrate to clean the substrate with the first rinse solution; and supplying a second rinse solution composed of a surfactant with a concentration lower than that of the first rinse solution onto the substrate to clean the substrate with the second rinse solution.

It is preferable that the concentration of the first rinse solution is 500 ppm to 1500 ppm, and that the concentration of the second rinse solution is 100 ppm to 400 ppm.

According to another aspect, the present invention is a developing treatment method of developing an exposed pattern, the pattern obtained after a resist film formed on a substrate is exposed in a predetermined pattern, the method including the steps of: applying a developing solution to the resist film after the exposure to cause development to proceed; rotating the substrate after the development to shake off the developing solution; supplying pure water onto the substrate to clean the substrate with the pure water; supplying a first rinse solution composed of a surfactant with a predetermined concentration onto the substrate to clean the substrate with the first rinse solution; and supplying a second rinse solution composed of a surfactant with a concentration lower than that of the first rinse solution onto the substrate to clean the substrate with the second rinse solution.

Also in this case, it is preferable that the concentration of the first rinse solution is 500 ppm to 1500 ppm, and that the concentration of the second rinse solution is 100 ppm to 400 ppm.

According to the present invention, the cleaning with the pure water first restrains the variation in pattern line width (CD), the cleaning with the surfactant with a high concentration then significantly removes the precipitation-based defects, and the cleaning with the surfactant with a low concentration finally restrains the pattern line width (CD) and keeps the lowered surface tension of the rinse solution.

Accordingly, the restraint of variation in the pattern line width and the removal of the precipitation-based defects are achieved, and the pattern collapse at the time of shaking-off drying is prevented. Further, the use of the surfactant allows the precipitation-based defects to be removed without extending the rinse time, resulting in prevention of a decrease in throughput to increase the productivity.

It is preferable to perform, after the step of cleaning the substrate with the second rinse solution, the steps of rotating the substrate for a predetermined time at a first rotation speed to move the rinse solution on the substrate to a periphery of the substrate; and rotating the substrate for a predetermined time at a second rotation speed higher than the first rotation speed to shake off the rinse solution moved to the periphery of the substrate to thereby dry the substrate.

This can shake off the precipitation-based defects together with the rinse solution without the periphery of the substrate from drying earlier than the other to reduce the number of precipitation-based defects remaining on the substrate after the drying processing.

According to still another aspect of the present invention, the present invention is a developing apparatus for performing developing treatment on a substrate including: a rotary mounting table for rotating the substrate mounted thereon; a first nozzle for supplying a surfactant from a surfactant supply source onto the substrate; a second nozzle for supplying pure water from a pure water supply source onto the substrate; and a mixing unit for mixing the surfactant from the surfactant supply source and the pure water from the pure water supply source to supply the mixture from the second nozzle.

According to yet another aspect of the present invention, the present invention includes: a rotary mounting table for rotating the substrate mounted thereon; a first nozzle for supplying a surfactant from a surfactant supply source onto the substrate; a second nozzle for supplying pure water from a pure water supply source onto the substrate; a third nozzle for supplying a surfactant from a surfactant supply source onto the substrate; and a nozzle housing member capable of housing discharge portions of the second nozzle and the third nozzle, the nozzle housing member having a discharge port at a lower portion thereof.

According to the present invention, in the rinse treatment of the substrate after developing treatment, it is possible to dry the substrate without causing pattern collapse to restrain variation in pattern line width, and to reduce the remaining precipitation-based defects to increase the productivity.

DETAILED DESCRIPTION OF THE PREFERRED EMBODIMENT

Figure 1:
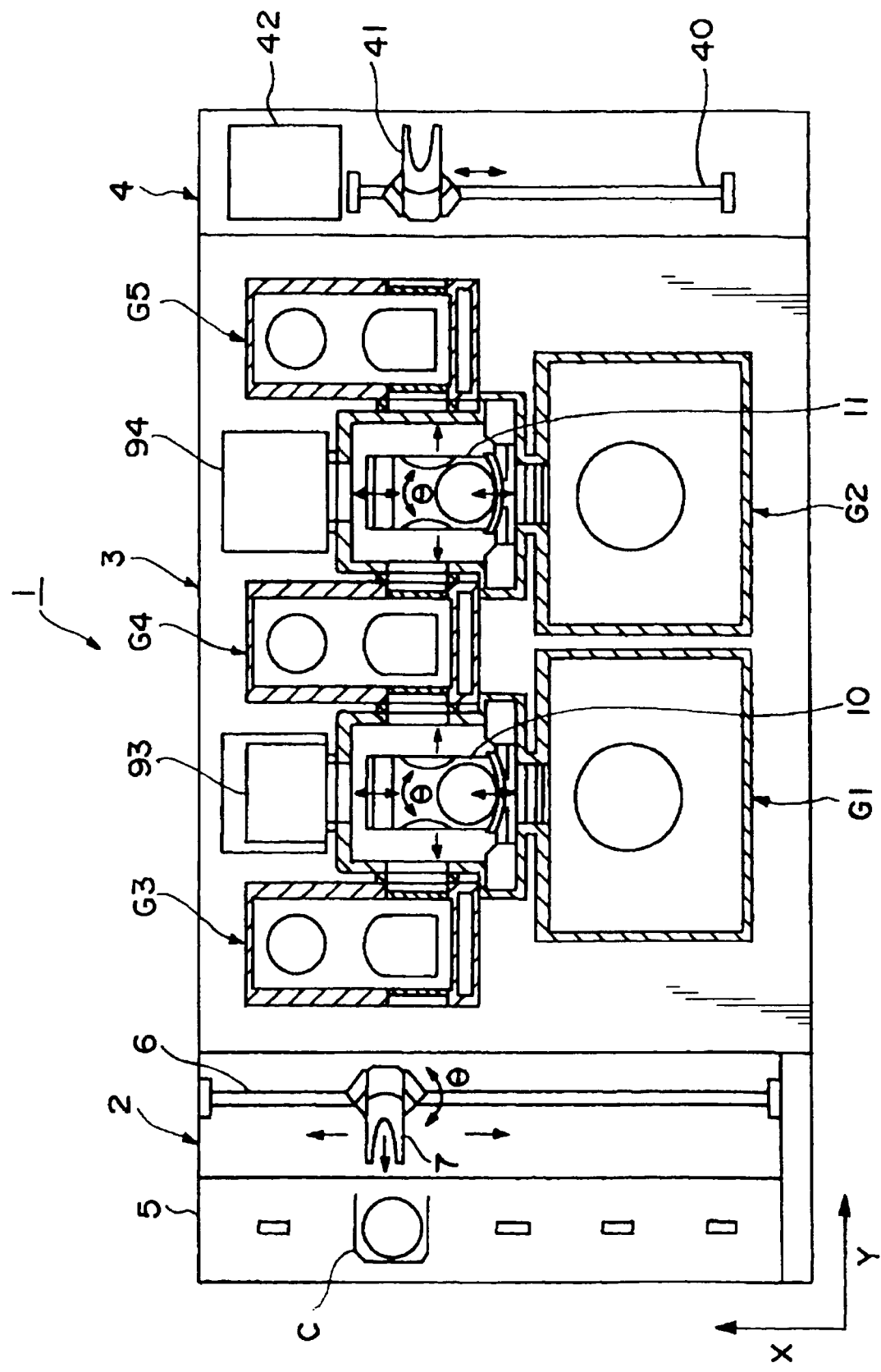
FIG. 1 is a plan view showing a schematic configuration of a coating and developing apparatus including a developing apparatus for carrying out a rinse treatment method and a developing treatment method according to the present invention.

Hereinafter, a rinse treatment method, a developing treatment method, and a developing apparatus according to the present invention will be described based on embodiments shown in the drawings. First of all, a coating and developing apparatus will be briefly described in which the rinse treatment method, the developing treatment method, and the developing apparatus according to the present invention are applied.

Figure 2:
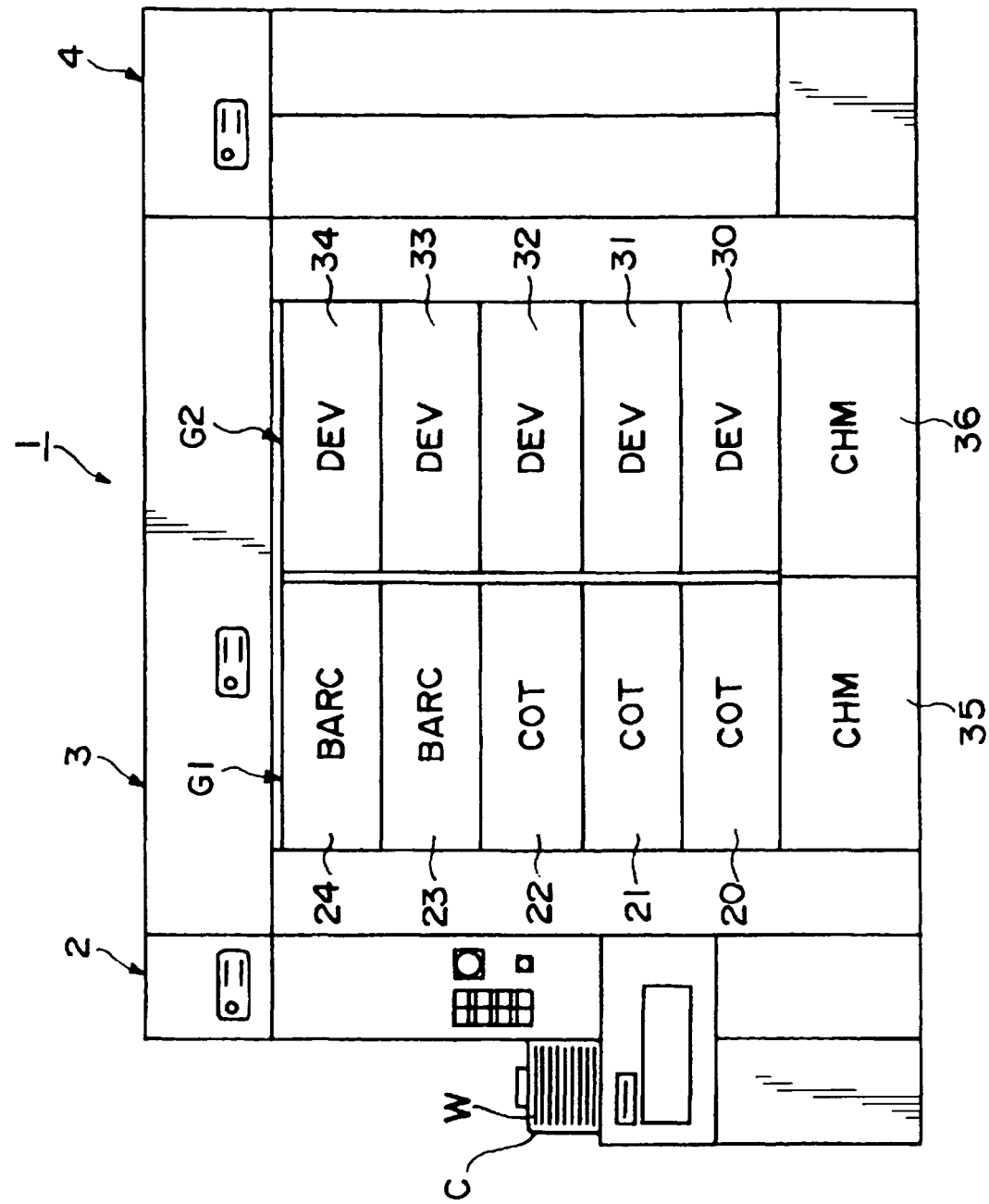
FIG. 2 is a front view of the coating and developing apparatus in FIG. 1.
Figure 3:
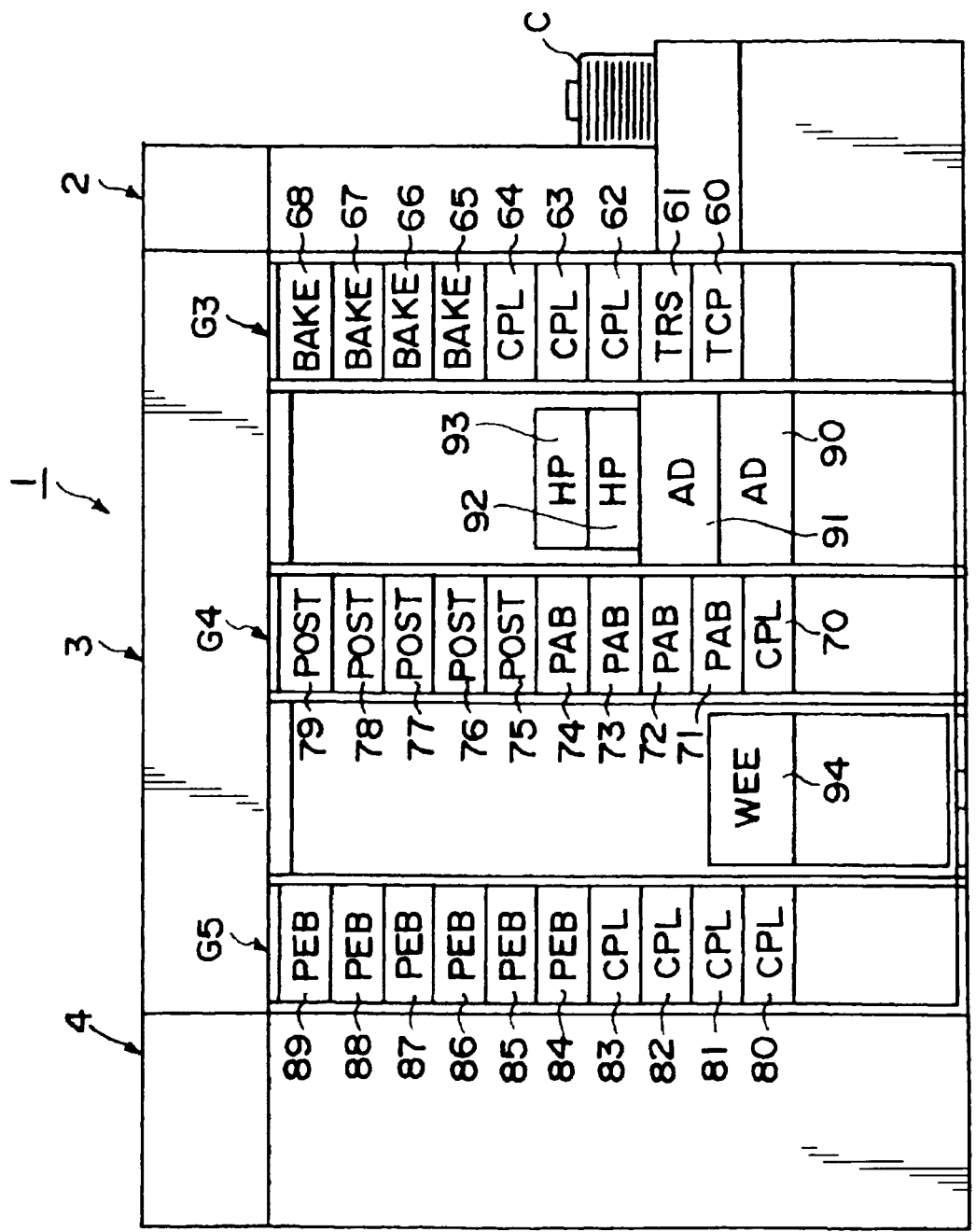
FIG. 3 is a rear view of the coating and developing apparatus in FIG. 1.

FIG. 1 is a plan view showing a schematic configuration of the coating and developing apparatus, FIG. 2 is a front view of the coating and developing apparatus in FIG. 1, and FIG. 3 is a rear view of the coating and developing apparatus in FIG. 1.

The illustrate coating and developing apparatus 1 performs a series of steps of a photolithography process on a wafer being a substrate to be processed in cooperation with an aligner (not shown) to form a predetermined resist pattern on the wafer.

As shown in FIG. 1, the coating and developing apparatus 1 has a configuration in which, for example, a cassette station 2 for carrying-in/out, for example, 25 wafers W per cassette as a unit from/to the outside and carrying-in/out the wafers W from/to a cassette C; a processing station 3 including a plurality of processing and treatment units, which are multi-tiered, for performing predetermined processing or treatment in a manner of single wafer processing in the photolithography process; and an interface section 4 for transferring the wafers W to/from the not-shown aligner provided adjacent to the processing station 3, are integrally connected together.

In the cassette station 2, a cassette mounting table 5 is provided and configured such that a plurality of cassettes C can be mounted on the cassette mounting table 5 in a line in an X-direction (a top-to-bottom direction in FIG. 1). In the cassette station 2, a wafer carrier 7 is provided which is movable in the X-direction on a carrier path 6. The wafer carrier 7 is also movable in a wafer-arrangement direction of the wafers W housed in the cassette C (a Z-direction; the vertical direction), and thus can selectively access the wafers W in each of the cassettes arranged in the X-axis direction.

The wafer carrier 7, which is rotatable in a θ-direction around the Z-axis, can access a temperature regulating unit 60 and a transition unit 61 which will be described later included in a third processing unit group G3 on the processing station 3 side.

The processing station 3 adjacent to the cassette station 2 includes, for example, five processing unit groups G1 to G5 in each of which a plurality of processing and treatment units are multi-tiered.

In the processing station 3, on the lower side in FIG. 1, the first processing unit group G1 and the second processing unit group G2 are placed in order from the cassette station 2 side. On the upper side in FIG. 1, the third processing unit group G3, the fourth processing unit group G4, and the fifth processing unit group G5 are placed in order from the cassette station 2 side.

Between the third processing unit group G3 and the fourth processing unit group G4, a first carrier unit 10 is provided. The first carrier unit 10 is configured to be able to selectively access the processing and treatment units in the first processing unit group G1, the third processing unit group G3, and the fourth processing unit group G4 and carry the wafer W to them.

Between the fourth processing unit group G4 and the fifth processing unit group G5, a second carrier unit 11 is provided. The second carrier unit 11 can selectively access the processing and treatment units in the second processing unit group G2, the fourth processing unit group G4, and the fifth processing unit group G5 and carry the wafer W to them.

In the first processing unit group G1, solution treatment units each for supplying a predetermined liquid to the wafer W to perform treatment, for example, resist coating units (COT) 20, 21, and 22 each for applying a resist solution to the wafer W, and bottom coating units (BARC) 23 and 24 each for forming an anti-reflection film that prevents reflection of light at the time of exposure processing, are five-tiered in order from the bottom as shown in FIG. 2.

In the second processing unit group G2, solution treatment units, for example, developing units (DEV) 30 to 34 as developing apparatuses according to the present invention each for supplying a developing solution to the wafer W to develop it are five-tiered in order from the bottom.

Further, chemical chambers (CHM) 35 and 36 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, the temperature regulating unit (TCP) 60, the transition unit (TRS) 61 for transferring the wafer W, high-precision temperature regulating units (CPL) 62 to 64 each for temperature-regulating the wafer W under temperature control with a high precision, and high-temperature thermal processing units (BAKE) 65 to 68 each for heat-processing the wafer W at a high temperature, are nine-tiered in order from the bottom.

In the fourth processing unit group G4, for example, a high-precision temperature regulating unit (CPL) 70, pre-baking units (PAB) 71 to 74 each for heat-processing the wafer W after resist coating treatment, and post-baking units (POST) 75 to 79 each for heat-processing the wafer W after developing treatment, are ten-tiered in order from the bottom.

In the fifth processing unit group G5, a plurality of thermal processing units each for performing thermal processing for the wafer W, for example, high-precision temperature regulating units (CPL) 80 to 83, and post-exposure baking units (PEB) 84 to 89 each for heat-processing the wafer W after exposure, are ten-tiered in order from the bottom.

A plurality of processing and treatment units are arranged on the positive direction side in the X-direction of the first carrier unit 10, for example, adhesion units (AD) 90 and 91 each for performing hydrophobic treatment on the wafer W and heating units (HP) 92 and 93 each for heating the wafer W being four-tiered in order from the bottom as shown in FIG. 3.

On the positive direction side in the X-direction of the second carrier unit 11, for example, an edge exposure unit (WEE) 94 is disposed which selectively exposes only the edge portion of the wafer W to light.

In the interface section 4, for example, a wafer carrier 41 moving on a carrier path 40 extending in the X-direction and a buffer cassette 42 are provided as shown in FIG. 1. The wafer carrier 41 is movable in the Z-direction and also rotatable in the θ-direction and thus can access the not-shown aligner adjacent to the interface section 4, the buffer cassette 42, and the fifth processing unit group G5 and carry the wafer W to them.

A series of steps of the photolithography process to the developing treatment is performed as follows by the coating and developing apparatus 1 configured as described above and the not-shown aligner.

First of all, one wafer W is carried from the cassette C housing unprocessed wafers W by the wafer carrier 7 in the cassette station 2 to the transition unit (TRS) 61 included in the third processing unit group G3. The wafer W is subjected to alignment there and then carried to the adhesion unit (AD) 90 or 91 where the wafer W is subjected to hydrophobic treatment. The wafer W is subsequently subjected to predetermined cooling processing in one of the high-precision temperature regulating units (CPL) 62 to 64, and carried to one of the resist coating units 20 to 22 in the first processing unit group G1 where the resist coating treatment is performed on the wafer surface. Note that the carriage of the wafer W from the transition unit 61 to the one of the resist coating units 20 to 22 is performed by the first carrier unit 10.

The wafer W is then carried by the first carrier unit 10 to one of the pre-baking units (PAB) 71 to 74 in the fourth processing unit group G4 where the wafer W is subjected to predetermined heat-processing, that is, pre-baking processing. The pre-baked wafer W is carried to the edge exposure unit (WEE) 94 where only the edge portion of the wafer W is subjected to exposure processing.

Thereafter, the wafer W is subjected to cooling processing in one of the high-precision temperature regulating units (CPL) 80 to 83 and then temporarily stored in the buffer cassette 42 by the wafer carrier 41 in the interface section 4.

The wafer W temporarily stored in the buffer cassette 42 is taken out by the wafer carrier 41 and transferred to the not-shown aligner where the wafer W is subjected to predetermined exposure processing.

The wafer W for which exposure processing has been finished is carried again via the interface section 4 to one of the post-exposure baking units (PEB) 84 to 89 in the fifth processing unit group G5 where the wafer W is subjected to heat-processing after exposure.

The wafer W is subsequently carried by the second carrier unit 11 to one of the developing units (DEV) 30 to 34 where the wafer W is subjected to developing treatment. The wafer W is then carried to one of the post-baking units (POST) 75 to 79 in the fourth processing unit group G4 where the wafer W is subjected to heat-processing after developing treatment. The wafer W is then subjected to cooling processing in one of the high-precision temperature regulating units (CPL) 62 to 64 in the third processing unit group G3 and returned to the cassette C by the wafer carrier 7.

Figure 4:
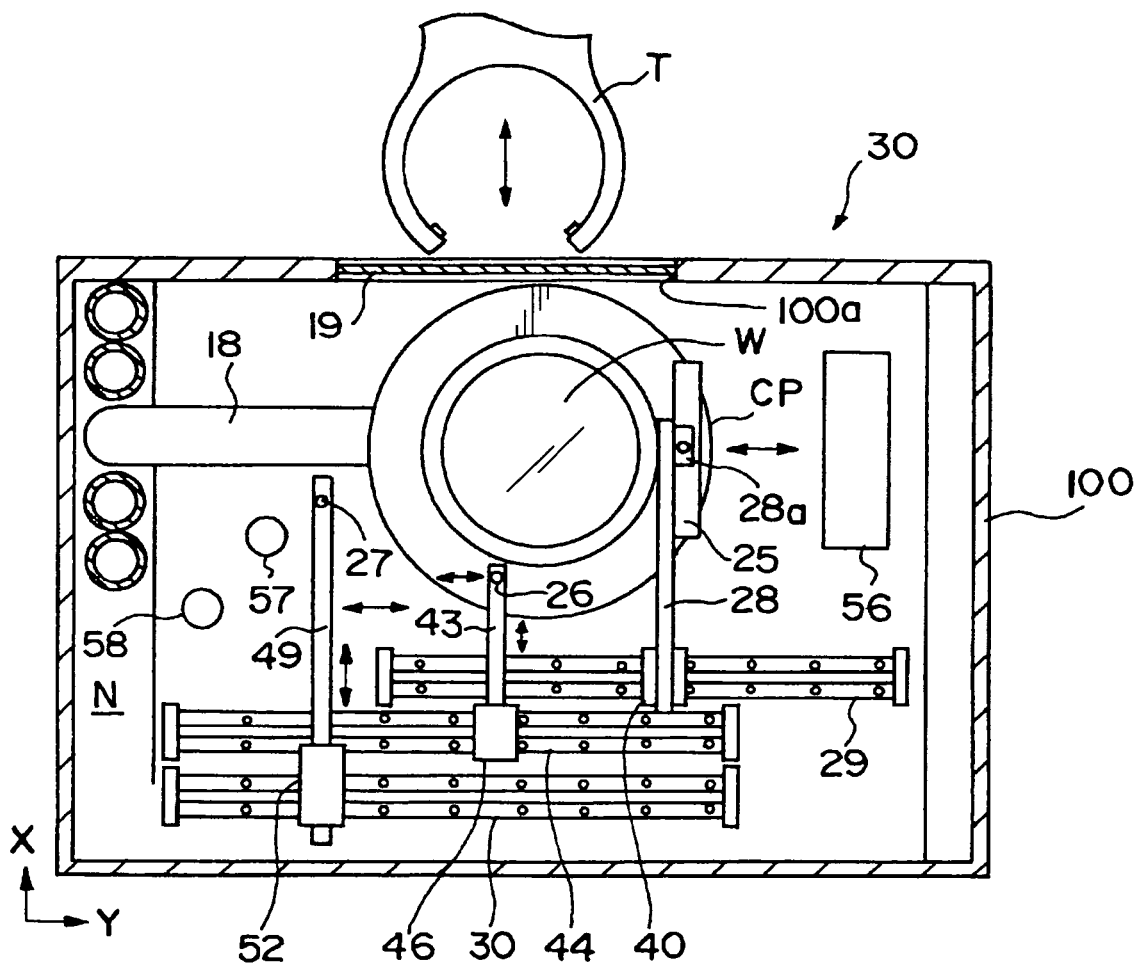
FIG. 4 is a plan view of a developing unit.
Figure 5:
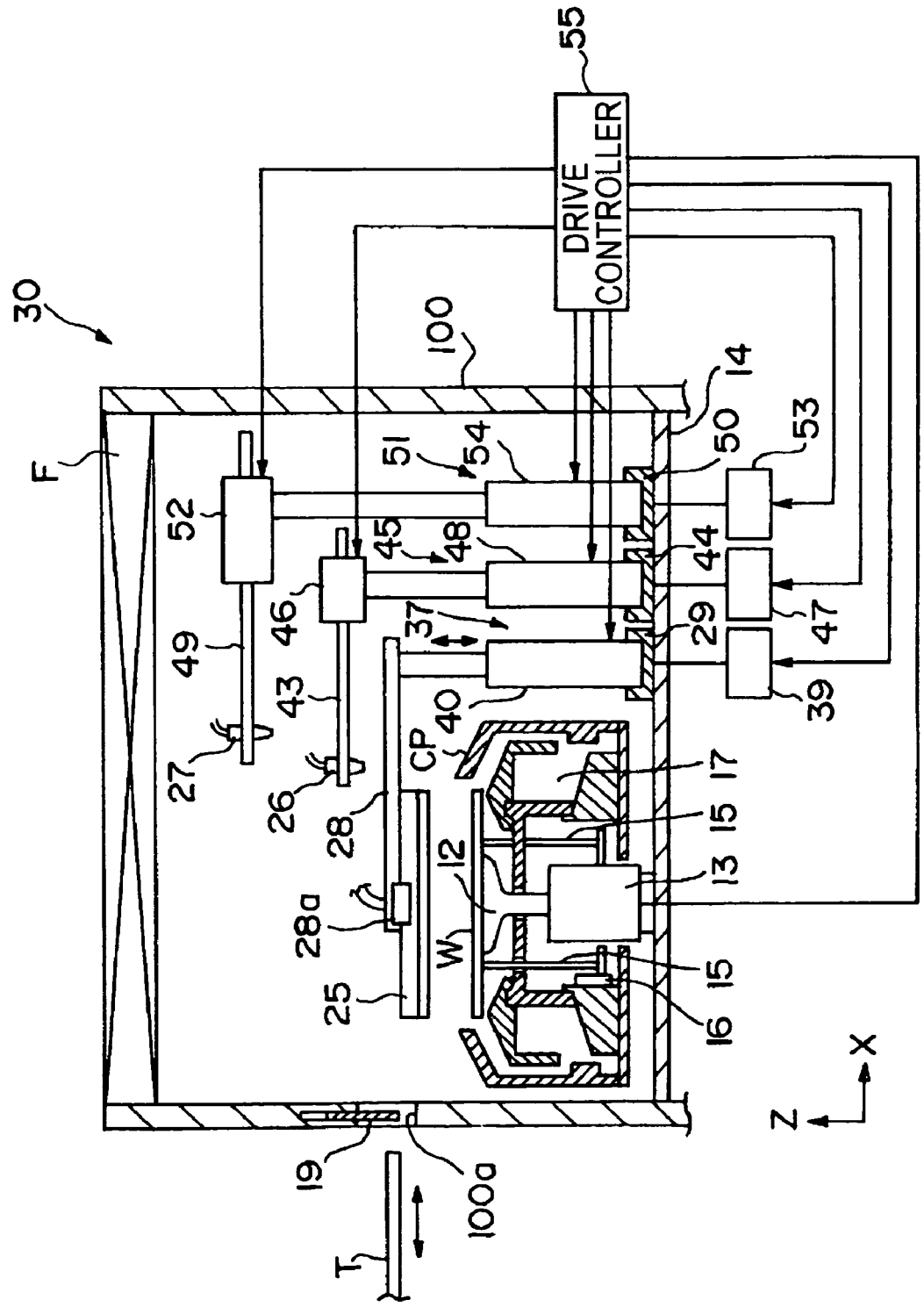
FIG. 5 is a cross-sectional view of the developing unit.

Next, the structures of the developing units (DEV) 30 to 34 to which the rinse treatment method, the developing treatment method, and the developing apparatus according to the present invention are applied, will be described in detail with reference to FIG. 4 and FIG. 5. Note that the plurality of developing units (DEV) 30 to 34 have the same configuration, and therefore only the structure of the developing unit (DEV) 30 will be illustrated in FIG. 4 and FIG. 5. FIG. 4 is a plan view of the developing unit (DEV) 30, and FIG. 5 is a cross-sectional view thereof.

The developing unit (DEV) 30 has a housing 100, and a fan-filter unit F is provided at the ceiling of the housing 100 for forming downflow of clean air in the housing. A circular cup CP is provided at the central portion of the housing 100, and a spin chuck 12 is disposed inside the cup CP. The spin chuck 12 securely holds the wafer W by vacuum suction. A driving motor 13 is disposed under the spin chuck 12 so that the spin chuck 12 is rotationally driven by the driving motor 13. The driving motor 13 is attached to a base plate 14.

Inside the cup CP, raising and lowering pins 15 for transferring the wafer W are provided such that they can rise and lower by means of a drive mechanism 16 such as a cylinder or the like. Inside the cup CP, a drain port 17 for drainage is provided. To the drain port 17, a drain pipe 18 is connected, and the drain pipe 18 passes through a space N between the base plate 14 and the housing 100 and is connected to a not-shown drain port thereunder as shown in FIG. 4.

In a side wall surface of the housing 100, an opening 100a is formed for allowing a carrier arm T of the second carrier unit 11 to enter and can be opened and closed by means of a shutter 19. When the wafer W is carried in/out, the shutter 19 is opened so that the carrier arm T enters the housing 100. The wafer W is transferred between the carrier arm T and the spin chuck 12 with the raising and lowering pins 15 raised.

Above the cup CP, a developing solution supply nozzle 25 for supplying a developing solution onto the front surface of the wafer W, a first rinse solution supply nozzle 26 for supplying a rinse solution composed of a surfactant onto the wafer W after development, and a second rinse solution supply nozzle 27 for supplying only pure water (DIW) or a rinse solution made by dissolving a surfactant in pure water onto the wafer W after development, are provided. Each of the nozzles is configured to be movable between a supply position above the wafer W and a waiting position outside the wafer W.

The developing solution supply nozzle 25 is formed in an elongated shape and disposed with its longitudinal direction kept horizontally and has a plurality of discharge ports on its lower surface so that the discharged developing solution forms a belt shape as a whole. The developing solution supply nozzle 25 is detachably attached to the tip portion of a first nozzle scan arm 28 through use of a holding member 28*a*. The first nozzle scan arm 28 is attached to the upper end portion of a first vertical support member 37 extending in the vertical direction from the top of a first guide rail 29 laid along the Y-direction on the base plate 14.

The developing solution supply nozzle 25 is configured to horizontally move along the Y-direction by means of a Y-axis drive mechanism 39 together with the first vertical support member 37.

The first vertical support member 37 can be raised and lowered by a Z-axis drive mechanism 40 so that the developing solution supply nozzle 25 is moved between a dischargeable position close to the wafer W and a non-discharge position thereabove by rising and lowering of the first vertical support member 37.

In the case of applying the developing solution to the wafer W, the developing solution supply nozzle 25 is located at a position above the wafer W, and the wafer W is rotated one-half turn or more, for example, one turn while the developing solution supply nozzle 25 is discharging the developing solution in a belt form, whereby the developing solution is applied on the entire surface of the wafer W to form a paddle of the developing solution. Note that at the time when discharging the developing solution, the developing solution supply nozzle 25 may be scanned along the first guide rail 29 without rotating the wafer W.

The first rinse solution supply nozzle 26 is configured as a straight nozzle. The first rinse solution supply nozzle 26 is detachably attached to the tip portion of a second nozzle scan arm 43. A second guide rail 44 is laid outside the first guide rail 29 on the base plate 14. The second scan nozzle scan arm 43 is attached to the upper end portion of a second vertical support member 45 extending in the vertical direction from the top of the second guide rail 44 via an X-axis drive mechanism 46.

The first rinse solution supply nozzle 26 is configured to horizontally move along the Y-direction by means of a Y-axis drive mechanism 47 together with the second vertical support member 45. Further, by rising and lowering of the second vertical support member 45, the first rinse solution supply nozzle 26 is moved between a dischargeable position close to the wafer W and a non-discharge position thereabove. Further, the second nozzle scan arm 43 is provided movable along the X-direction by means of the X-axis drive mechanism 46.

The second rinse solution supply nozzle 27 is configured as a straight nozzle, similar to the first rinse solution supply nozzle 26. The second rinse solution supply nozzle 27 is detachably attached to the tip portion of a third nozzle scan arm 49. A third guide rail 50 is laid outside the second guide rail 44 on the base plate 14. The third scan nozzle scan arm 49 is attached to the upper end portion of a third vertical support member 51 extending in the vertical direction from the top of the third guide rail 50 via an X-axis drive mechanism 52.

The second rinse solution supply nozzle 27 is configured to horizontally move along the Y-direction by means of a Y-axis drive mechanism 53 together with the third vertical support member 51. Further, the third vertical support member 51 can be raised and lowered by a Z-axis drive mechanism 54 so that the second rinse solution supply nozzle 27 is moved between a dischargeable position close to the wafer W and a non-discharge position thereabove by rising and lowering of the third vertical support member 51. Further, the third scan arm nozzle 49 is provided movable along the X-direction by means of the X-axis drive mechanism 52.

It should be noted that the Y-axis drive mechanisms 39, 47 and 53, the Z-axis drive mechanisms 40, 48 and 54, the X-axis drive mechanisms 46 and 52, and the driving motor 13 are controlled by a drive controller 55. The first rinse solution supply nozzle 26 and the second rinse solution supply nozzle 27 can pass each other in the Y-direction.

Besides, as shown in FIG. 4, on the right side of the cup CP, a developing solution supply nozzle waiting unit 56 where the developing solution supply nozzle 25 waits is provided in which a cleaning mechanism (not shown) is provided for cleaning the developing solution supply nozzle 25. Further, on the left side of the cup CP, a first rinse solution supply nozzle waiting unit 57 and a second rinse solution supply nozzle waiting unit 58 are provided respectively in which cleaning mechanisms (not shown) are provided for cleaning the respective nozzles.

Figure 6:
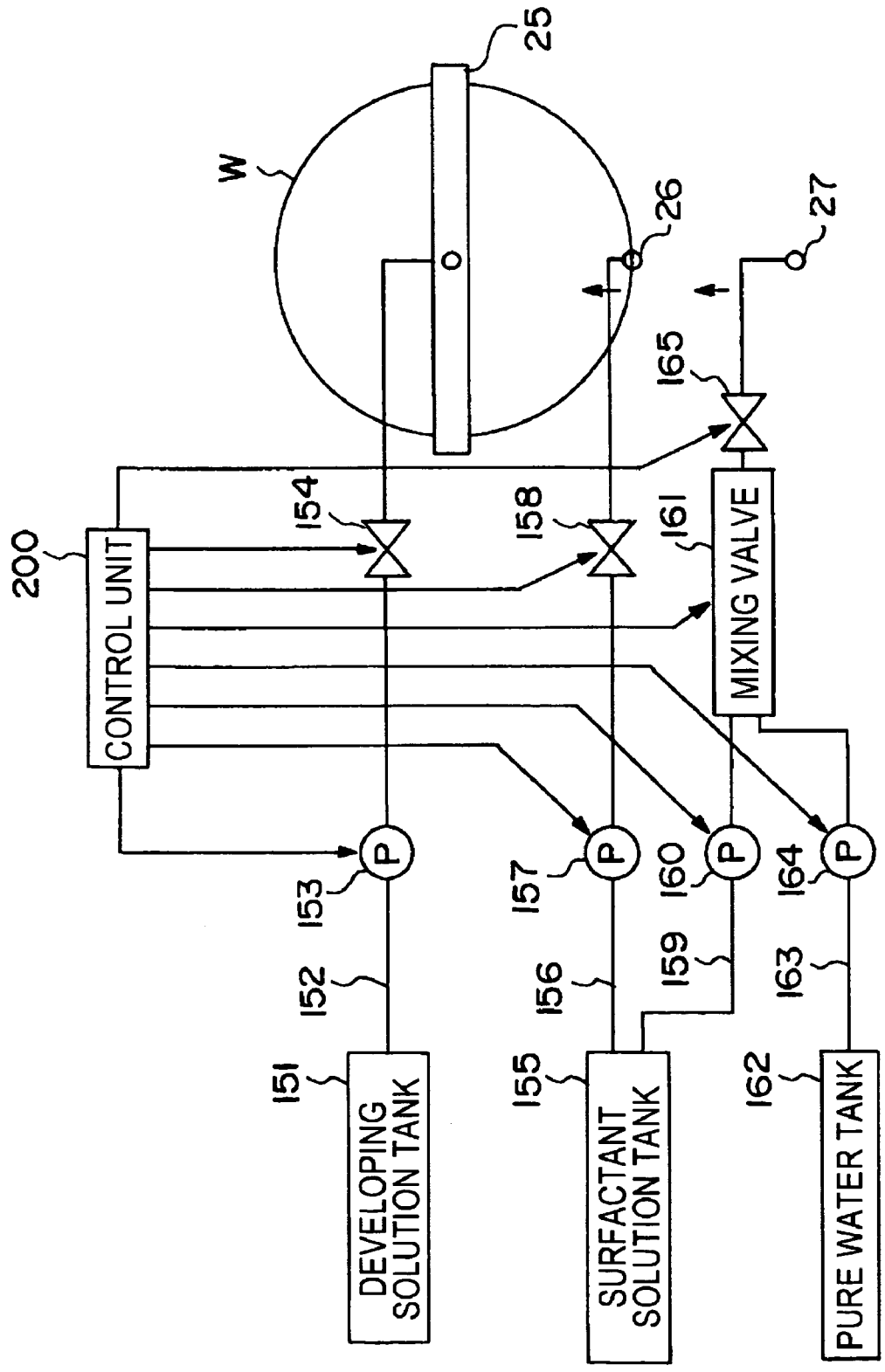
FIG. 6 is a schematic diagram showing a solution supply system of the developing unit.

Next, a treatment solution supply system of the developing unit (DEV) 30 will be described with reference to FIG. 6. FIG. 6 is a schematic diagram showing the solution supply system of the developing unit (DEV) 30.

As shown in FIG. 6, to the developing solution supply nozzle 25, a developing solution supply pipe 152 is connected which supplies the developing solution from a developing solution tank 151 storing the developing solution. Along the developing solution supply pipe 152, a pump 153 and an ON/OFF valve 154 are provided for supplying the developing solution.

To the first rinse solution supply nozzle 26, a surfactant solution supply pipe 156 is connected which supplies the surfactant solution from a surfactant solution tank 155. Along the surfactant solution supply pipe 156, a pump 157 and an ON/OFF valve 158 are provided for supplying the surfactant solution.

Note that the surfactant solution supplied from the surfactant solution tank 155 is desirably an aqueous solution containing a polyethylene glycol-based or acetylene glycol-based surfactant having a molecular weight of 1600 or less and a carbon number of its hydrophobic group of 10 or greater. It is more desirable that the hydrophobic group of the surfactant is not double-bonded or triple-bonded.

To the second rinse solution supply nozzle 27, a surfactant solution supply pipe 159 is connected which supplies the surfactant solution from the surfactant solution tank 155. Along the surfactant solution supply pipe 159, a mixing valve 161 is provided, and a pure water supply pipe 163 extending from a pure water tank 162 storing pure water is connected to the mixing valve 161. The mixing valve 161 allows the surfactant solution and the pure water to be mixed.

Upstream of the mixing valve 161 along the surfactant solution supply pipe 156 and the pure water supply pipe 163, pumps 160 and 164 are provided respectively. Downstream of the mixing valve 161, an ON/OFF valve 165 is provided.

Thus, it is possible to discharge, from the second rinse solution supply nozzle 27, a rinse solution made by mixing the surfactant solution and the pure water, that is, a rinse solution having a concentration of the surfactant lower than that of the rinse solution discharged from the first rinse solution supply nozzle 26.

Alternatively, it is also possible to block the supply of the surfactant solution by control of operations of the pump 160 and the mixing valve 161 to thereby discharge only the pure water from the second rinse solution supply nozzle 27.

The pumps 153, 157, 160 and 164, the ON/OFF valves 154, 158 and 165, and the mixing valve 161 are controlled by a control unit 200.

Next, the processing steps from the development to the cleaning (rinse treatment) in the developing unit (DEV) 30 will be described with reference to the flow in FIG. 7.

Figure 7:
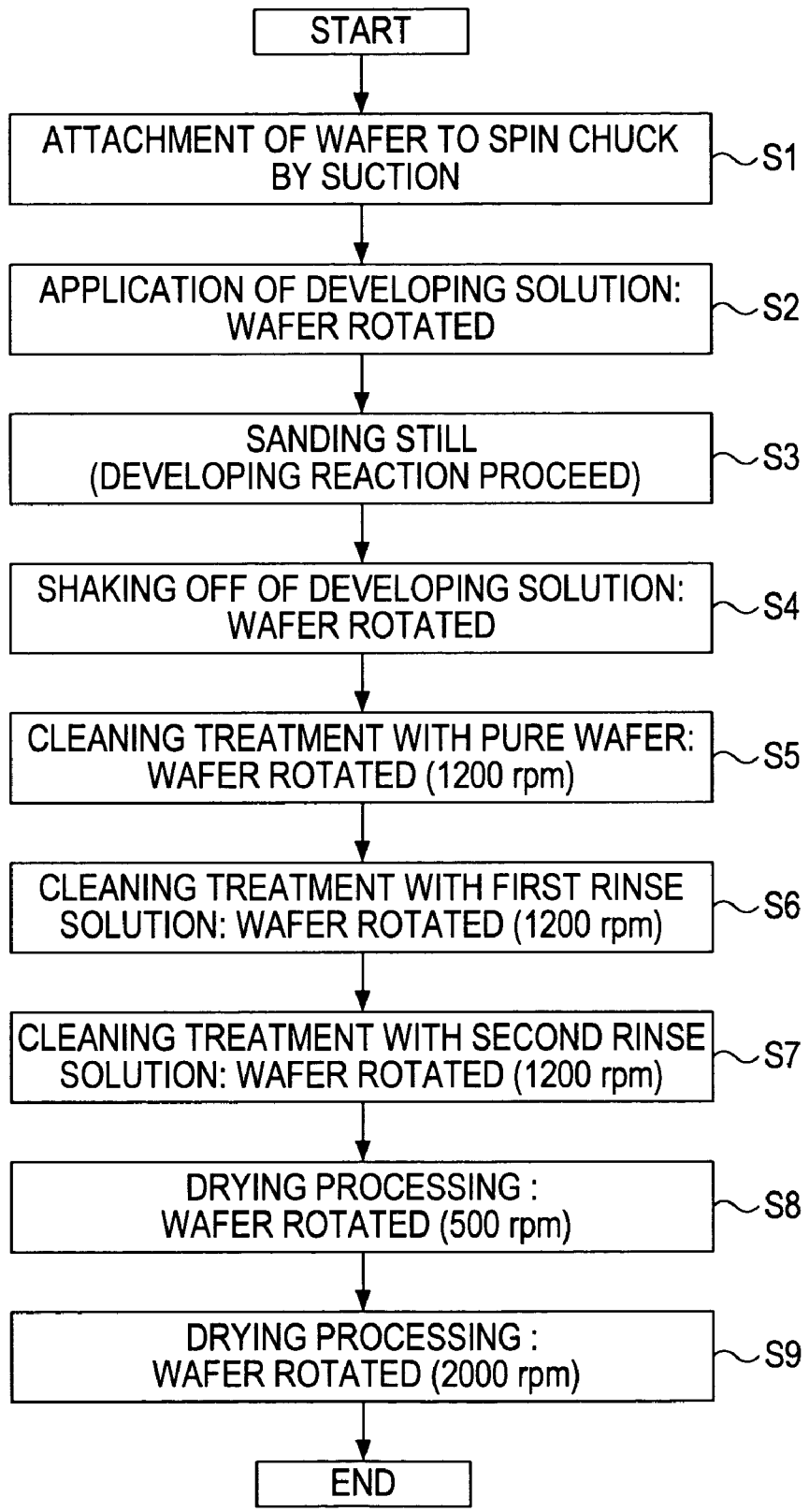
FIG. 7 is a flowchart showing processing steps from development to cleaning (rinse treatment) in the developing unit.

First of all, the wafer W having the predetermined pattern exposed and subjected to the post-exposure baking (PEB) processing and cooling processing is carried by the carrier arm T of the second carrier unit 11 to a position directly above the cup CP, transferred to the raising and lowering pins 15, and then mounted on and attached to the spin chuck 12 by vacuum suction (Step S1 in FIG. 7).

Then, the developing solution supply nozzle 25 moves to a position above the center of the wafer W, and the wafer W is rotated one-half turn or more, for example, one turn while the developing solution supply nozzle 25 is discharging the developing solution, whereby the developing solution is applied on the entire surface of the wafer W to form a paddle of the developing solution (Step S2 in FIG. 7). Note that the developing solution supply nozzle 25 may discharge the developing solution while scanning along the guide rail 29.

The developing solution applied on the wafer W as described above is kept sanding still for an appropriate time, for example, 60 seconds or longer to cause development to proceed (Step S3 in FIG. 7). In this event, the developing solution supply nozzle 25 is retracted to the outside of the cup CP, and the nozzle arm 49 of the second rinse solution supply nozzle 27 is moved so that the second rinse solution supply nozzle 27 is located at a position above the center of the wafer W. After a lapse of a predetermined time for causing the developing to proceed, the spin chuck 12 rotates the wafer W to shake off the developing solution (Step S4 in FIG. 7).

Subsequently, the wafer W is rotated at a predetermined number of rotations (for example, 1200 rpm) while the second rinse solution supply nozzle 27 is discharging pure water for a predetermined time (for example, 1 sec to 10 sec), whereby cleaning is performed (Step S5 in FIG. 7).

The reason why cleaning with pure water containing no surfactant is performed first in this cleaning step is to prevent variation in the pattern line width due to permeation of the surfactant into the pattern which occurs when the surfactant is supplied to the resist pattern immediately after developing treatment which has swelled and increased in permeability.

In other words, cleaning with pure water performed first replaces the developing solution on the wafer W with the pure water to wash away the developing solution and restrains variation in the pattern line width (CD).

Subsequently, the fist rinse solution supply nozzle 26 is moved to a position above the center of the wafer W and the second rinse solution supply nozzle 27 is retracted concurrently therewith. The wafer W is then rotated at a predetermined rotation speed (for example, 1200 rpm) while the first rinse solution supply nozzle 26 is discharging the surfactant solution (the first rinse solution) with a predetermined concentration (for example, 500 ppm to 1500 ppm) for a predetermined time (for example, 1 sec to 10 sec), whereby cleaning is performed (Step S6 in FIG. 7).

The cleaning with the surfactant solution decreases the surface tension of the rinse solution on the substrate to remove most of precipitation-based defects remaining on the wafer to the outside of the wafer W together with the rinse solution.

Subsequently, the second rinse solution supply nozzle 27 is moved again to the position above the center of the wafer W, and the first rinse solution supply nozzle 26 is retracted concurrently therewith. The wafer W is rotated at a predetermined rotation speed (for example, 1200 rpm) while the second rinse solution supply nozzle 27 is discharging a surfactant solution mixed with pure water (the second rinse solution) with a predetermined concentration (for example, 100 ppm to 400 ppm) for a predetermined time (for example, 1 sec to 10 sec), whereby cleaning is performed (Step S7 in FIG. 7).

The surfactant solution discharged from the second rinse solution supply nozzle 27 is made lower in concentration than the surfactant solution discharged from the first rinse solution supply nozzle 26 so that the permeability of the former surfactant solution into the resist pattern is decreased, whereby the variation in the pattern line width (CD) is restrained. Further, the surface tension of the rinse solution is kept lowered.

After the rinse solution is supplied to the wafer W in the above-described Step S7, the rinse solution supply nozzle 27 is retracted to the outside of the cup CP, and the number of rotations of the wafer W is decreased (a first rotation speed: for example, 500 rpm). The rotation of the wafer W at the low rotation speed for a predetermined time moves the rinse solution to the periphery of the wafer W (Step S8 in FIG. 7). This gathers precipitation-based defects on the wafer W which have not been washed away in the cleaning with the rinse solutions into the rinse solution moved to the periphery of the wafer W.

Subsequently, the rotation speed of the wafer W is increased to a high rotation speed (a second rotation speed: for example, 2000 rpm), whereby the rinse solution moved to the periphery of the wafer W is shaken off to the outside of the wafer W. The wafer W is rotated at the predetermined high rotation speed for a predetermined time, whereby drying processing is performed for the wafer W (Step S9 in FIG. 7). This also shakes off the precipitation-based defects gathered during the rinse to the outside of the wafer W at the same time.

In the case where the wafer W is subjected to drying processing only at the high rotation speed with the step of rotating the wafer W at the low speed in the above-described step S8 being omitted, the periphery of the wafer W can be rapidly dried earlier than the other, thus failing to remove the precipitation-based defects remaining on the wafer W, which can deposit on the periphery of the wafer W. Hence, as described above, the rotation step of the wafer W at the low rotation speed (Step S8) is carried out before the drying processing of the wafer W at the high rotation speed (Step S9), whereby the rapid drying of the wafer W from its periphery is restrained. Accordingly, the precipitation-based defects can be shaken off concurrently with the rinse solution, resulting in further reduction of the precipitation-based defects remaining on the wafer.

Since the rinse solution shaken off to the outside of the wafer W in the above-described Step S9 is the surfactant solution, the surface tension of the rinse solution is kept lowered. Consequently, the precipitation-based defects become easy to be shaken off to the outside of the wafer W, and the pattern collapse at the time of shaking-off drying is prevented.

As described above, according to this embodiment, the cleaning with the pure water, the cleaning with the surfactant solution with a high concentration, and the cleaning with the surfactant solution with a low concentration are performs in sequence in the rinse treatment for the wafer W whose exposed pattern has been subjected to developing treatment.

In other words, the cleaning with the pure water first restrains the variation in the pattern line width (CD), the cleaning with the surfactant with a high concentration then significantly removes the precipitation-based defects, and the cleaning with the surfactant with a low concentration finally restrains the pattern line width (CD) and keeps the lowered surface tension of the rinse solution.

This achieves the restraint of variation in the pattern line width and the removal of the precipitation-based defects as well as the pattern collapse at the time of shaking-off drying. Further, the use of the surfactant allows the precipitation-based defects to be removed without extending the rinse time, resulting in prevention of a decrease in throughput to increase the productivity.

Furthermore, at the time of shaking-off drying of the rinse solution on the wafer W, the wafer W is first rotated at the low rotation speed for a predetermined time and then at the high rotation speed for drying processing for the wafer W. This prevents the periphery of the wafer W from drying earlier than the other to reduce the number of precipitation-based defects remaining on the wafer after the drying processing.

Note that while the second rinse solution supply nozzle 27 discharging the surfactant solution and pure water after mixing them or discharging only pure water has a form such that the solution and pure water are mixed at the mixing valve 161 and the resulting rinse solution is discharged from the one straight nozzle, the nozzle is not limited to that form in the developing apparatus according to the present invention.

Figure 8:
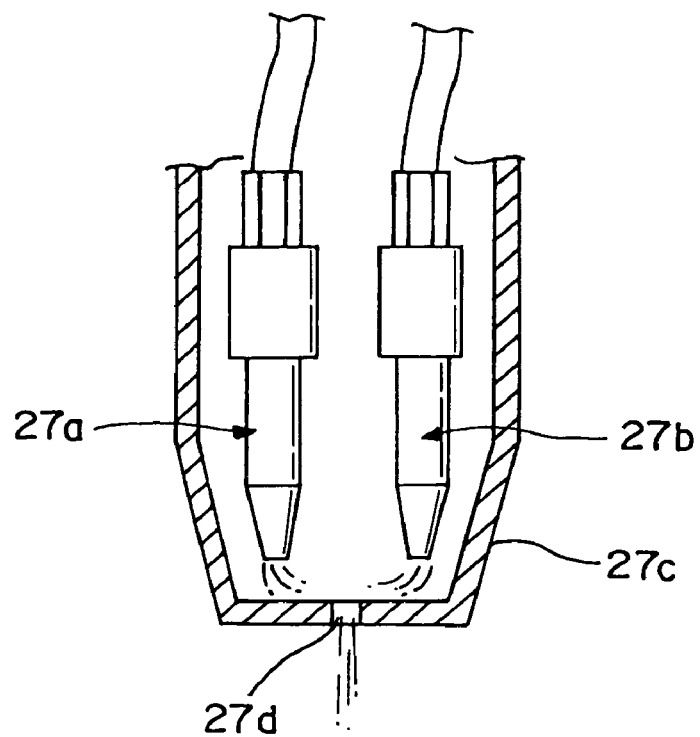
FIG. 8 is a view showing another form of a second rinse solution supply nozzle.

For example, the second rinse solution supply nozzle 27 may be configured such that a straight nozzle 27a discharging the surfactant solution and a straight nozzle 27b discharging the pure water may be installed in a nozzle case 27c formed with a discharge port 27d at its lower portion as shown in FIG. 8.

More specifically, for discharge of only the pure water, the straight nozzle 27b discharges the pure water with the discharge from the straight nozzle 27a being stopped, whereby the pure water is discharged from the discharge port 27d onto the wafer W.

Besides, for mixing the surfactant solution with pure water, the straight nozzle 27a discharges the surfactant solution and the straight nozzle 27b discharges the pure water, whereby the two are mixed in the nozzle case 27c so that the surfactant solution mixed with the pure water is discharged from the discharge port 27d onto the wafer W.

Figure 9:
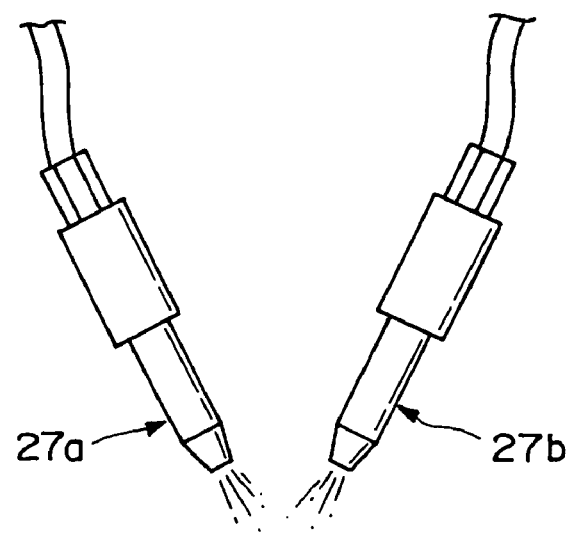
FIG. 9 is a view showing another form of the second rinse solution supply nozzle.

Alternatively, the second rinse solution supply nozzle 27 may be composed of a straight nozzle 27a discharging the surfactant solution and a straight nozzle 27b discharging the pure water as shown in FIG. 9.

More specifically, for discharge of only the pure water, the straight nozzle 27b discharges the pure water with the discharge from the straight nozzle 27a being stopped, whereby only the pure water is discharged onto the wafer W.

Besides, for mixing the surfactant solution with pure water, they are discharged from both nozzles at the same time to be mixed on the wafer W.

Figure 10:
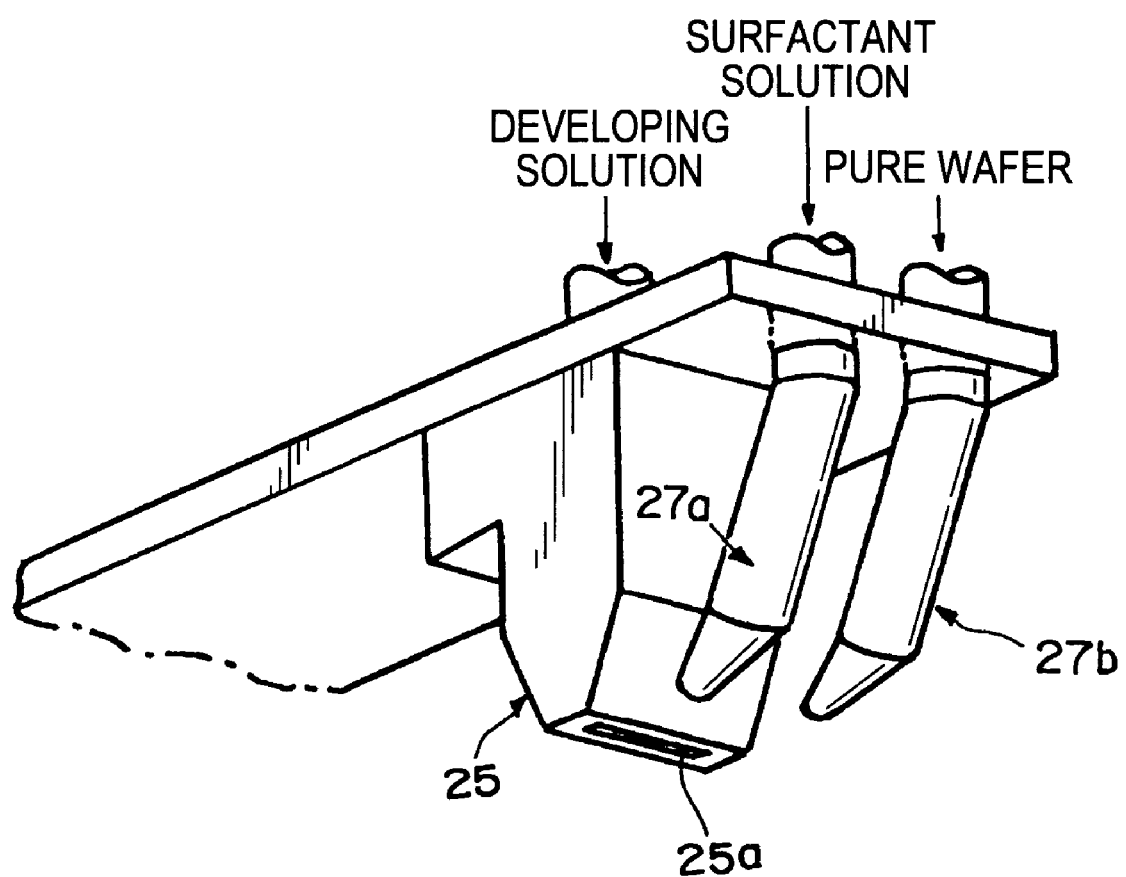
FIG. 10 is a view showing other forms of a developing solution supply nozzle and the second rinse solution supply nozzle.

In the case of the configuration shown in FIG. 9, the straight nozzle 27a and the straight nozzle 27b may be configured such that they are held by an arm (holding member) common with the developing solution supply nozzle 25 as shown in FIG. 10. In this case, it is desirable that the developing solution supply nozzle 25 having an elongated discharge port 25a is formed in a compact shape as shown in FIG. 10 in consideration of control of movement of the nozzle and so on.

Such configuration allows the member to be shared in the developing unit (DEV) 30, so that the apparatus configuration can be made smaller, presenting an effect of reducing cost and footprint.

Note that at the time when supplying the developing solution onto the wafer W through use of the configuration shown in FIG. 10, it is only required to rotate the wafer W about the vertical axis and move the nozzle 25 from the outside of the wafer W to the central portion while discharging the developing solution in a band shape from the discharge port 25a. This can supply the developing solution in a spiral shape on the entire surface of the wafer W.

While the semiconductor wafer is taken as an example of the substrate to be processed in the above-described embodiments, the substrate in the present invention is not limited to the semiconductor wafer but can be an LCD substrate, a CD substrate, a glass substrate, a photomask, a printed board and so on.

The present invention is applicable to a rinse treatment method of performing rinse treatment on a substrate such as a semiconductor wafer after an exposed pattern thereon has been subjected to developing treatment in the photolithography process and a developing treatment method and a developing apparatus each carrying out the rinse treatment method, and can be preferably used in the semiconductor manufacturing industry, electronic device manufacturing industry and so on.

What is claimed is:

1. A developing treatment method of developing an exposed pattern, said pattern obtained after a resist film formed on a substrate is exposed in a predetermined pattern, said method comprising the steps of:
    applying a developing solution to the resist film after the exposure to cause development to proceed;
    rotating the substrate after the development to shake off the developing solution;
    supplying pure water onto the substrate to clean the substrate with the pure water;
    supplying a first rinse solution composed of a surfactant with a concentration of 500 ppm to 1500 ppm onto the substrate to clean the substrate with the first rinse solution;
    supplying a second rinse solution composed of a surfactant with a concentration of 100 ppm to 400 ppm onto the substrate to clean the substrate with the second rinse solution;
    after said step of cleaning the substrate with the second rinse solution,
    rotating the substrate for a predetermined time at a first rotation speed to move the rinse solution on the substrate to a periphery of the substrate; and
    rotating the substrate for a predetermined time at a second rotation speed higher than the first rotation speed to shake off the rinse solution moved to the periphery of the substrate to thereby dry the substrate, thereby restrain variation in pattern line width attributed to pattern collapse, and, at the same time, thereby reduce precipitation-based defects
    wherein the substrate is rotated at a same predetermined rotation speed while cleaning the substrate with the pure water, cleaning the substrate with the first rinse solution and cleaning the substrate with the second rinse solution are performed, and said same predetermined rotation speed is higher than the first rotation speed.

2. A developing treatment method of developing an exposed pattern obtained after a resist film on a substrate has been exposed in a predetermined pattern, said method comprising the steps of:

applying a developing solution to the resist film after the exposure to cause development to proceed;

rotating the substrate after the development to shake off the developing solution;

supplying pure water onto the substrate to clean the substrate with the pure water;

supplying a first rinse solution, composed of a surfactant with a predetermined concentration, onto the substrate to clean the substrate;

supplying a second rinse solution, composed of a surfactant with a concentration lower than that of the first rinse solution, onto the substrate to clean the substrate while restraining variation in line width of the exposed pattern;

after said step of cleaning the substrate with the second rinse solution, rotating the substrate for a predetermined time at a first rotation speed to move the rinse solution and precipitation-based defects on the substrate to a periphery of the substrate; and after said step of rotating the substrate for a predetermined time at the first rotation speed, rotating the substrate for a predetermined time at a second rotation speed higher than the first rotation speed to shake off the rinse solution moved to the periphery of the substrate to thereby dry the substrate and shake off the precipitation-based defects, wherein the substrate is rotated at a same predetermined rotation speed while cleaning the substrate with the pure water, cleaning the substrate with the first rinse solution and cleaning the substrate with the second rinse solution are performed, and wherein said same predetermined rotation speed is higher than the first rotation speed.

3. The developing treatment method of claim 1, wherein the supplying pure water first restrains variation in pattern line width, then cleaning with the first rinse solution removes precipitation-based defects, and cleaning with the second rinse solution restrains pattern line width variation and keeps the lowered surface tension of the rinse solution.

* * * * *